United States Patent
Ma et al.

(10) Patent No.: US 8,929,088 B2
(45) Date of Patent: Jan. 6, 2015

(54) ELECTRONIC DEVICE WITH MOTHERBOARD

(71) Applicants: Hong Fu Jin Precision Industry (ShenZhen) Co., Ltd., Shenzhen (CN); Hon Hai Precision Industry Co., Ltd., New Taipei (TW)

(72) Inventors: Song Ma, Shenzhen (CN); Li-Ren Fu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 46 days.

(21) Appl. No.: 13/847,443

(22) Filed: Mar. 19, 2013

(65) Prior Publication Data

US 2014/0218880 A1     Aug. 7, 2014

(30) Foreign Application Priority Data

Feb. 5, 2013   (CN) .......................... 2013 1 0044635

(51) Int. Cl.
*H05K 5/00*   (2006.01)
*H05K 7/14*   (2006.01)

(52) U.S. Cl.
CPC .................................. *H05K 7/1417* (2013.01)
USPC ........ 361/759; 361/816; 361/818; 174/138 E; 174/138 G

(58) Field of Classification Search
CPC .................................. H05K 7/14; H05K 5/00
USPC ............ 361/759, 816, 818; 174/138 E, 138 G
See application file for complete search history.

(56) References Cited

U.S. PATENT DOCUMENTS

| | | | |
|---|---|---|---|
| 6,171,131 B1 * | 1/2001 | Lee | 439/358 |
| 6,287,138 B1 * | 9/2001 | Kuang | 439/372 |
| 6,356,450 B1 * | 3/2002 | Andreasen et al. | 361/759 |
| 6,798,669 B1 * | 9/2004 | Hsu | 361/801 |
| 7,298,609 B2 * | 11/2007 | Jeong | 361/679.55 |
| 7,315,458 B1 * | 1/2008 | Lin | 361/807 |
| 7,330,358 B2 * | 2/2008 | Chen et al. | 361/810 |
| 7,394,664 B1 * | 7/2008 | Chang | 361/801 |
| 7,614,672 B2 * | 11/2009 | Smith et al. | 292/336.3 |
| 7,876,569 B2 * | 1/2011 | Xue | 361/759 |
| 7,922,506 B1 * | 4/2011 | Harlan et al. | 439/160 |
| 8,205,918 B2 * | 6/2012 | Hsu | 292/83 |

(Continued)

*Primary Examiner* — Lisa Lea Edmonds
*Assistant Examiner* — Rashen E Morrison
(74) *Attorney, Agent, or Firm* — Novak Druce Connolly Bove + Quigg LLP

(57) ABSTRACT

An electronic device includes a motherboard defining a number of through holes, a bottom wall forming a number of posts, and a fixing member including a fixing body mounted to the bottom wall and a movable body slidably mounted to the fixing body. Each through hole includes a first hole and a second hole communicating with each other. Each post includes a supporting portion, a head, and a neck. The fixing body forms a protrusion. The movable body includes a main portion, a connecting portion connected to the main portion and defining a limiting slot. The heads are extended through the first holes; the necks abut end walls bounding the second holes. The motherboard is sandwiched between the heads and the supporting portions, the protrusion is engaged in the limiting slot, and the main body abuts against an end of the motherboard adjacent to the fixing member.

8 Claims, 6 Drawing Sheets

(56) References Cited

U.S. PATENT DOCUMENTS

| | | | |
|---|---|---|---|
| 8,534,628 B2 * | 9/2013 | Lu | 248/309.1 |
| 8,562,036 B2 * | 10/2013 | Zhou | 292/256 |
| 8,573,990 B2 * | 11/2013 | Cheng et al. | 439/135 |
| 8,602,677 B2 * | 12/2013 | Peng et al. | 403/329 |
| 2009/0253285 A1 * | 10/2009 | Yang | 439/312 |
| 2013/0164965 A1 * | 6/2013 | Yin et al. | 439/357 |
| 2013/0216303 A1 * | 8/2013 | Tang et al. | 403/326 |
| 2013/0258629 A1 * | 10/2013 | Fu | 361/785 |

* cited by examiner

ELECTRONIC DEVICE WITH MOTHERBOARD

CROSS-REFERENCE OF RELATED APPLICATION

Relevant subject matter is disclosed in a pending U.S. patent application, titled "ELECTRONIC DEVICE WITH MOTHERBOARD", filed on Mar. 14, 2013, with the application Ser. No. 13/830,578, which is assigned to the same assignee as this patent application.

BACKGROUND

1. Technical Field

The present disclosure relates to an electronic device including a motherboard.

2. Description of Related Art

Motherboards are often mounted to bottom walls of chassis with screws, which is time consuming if installing and uninstalling.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
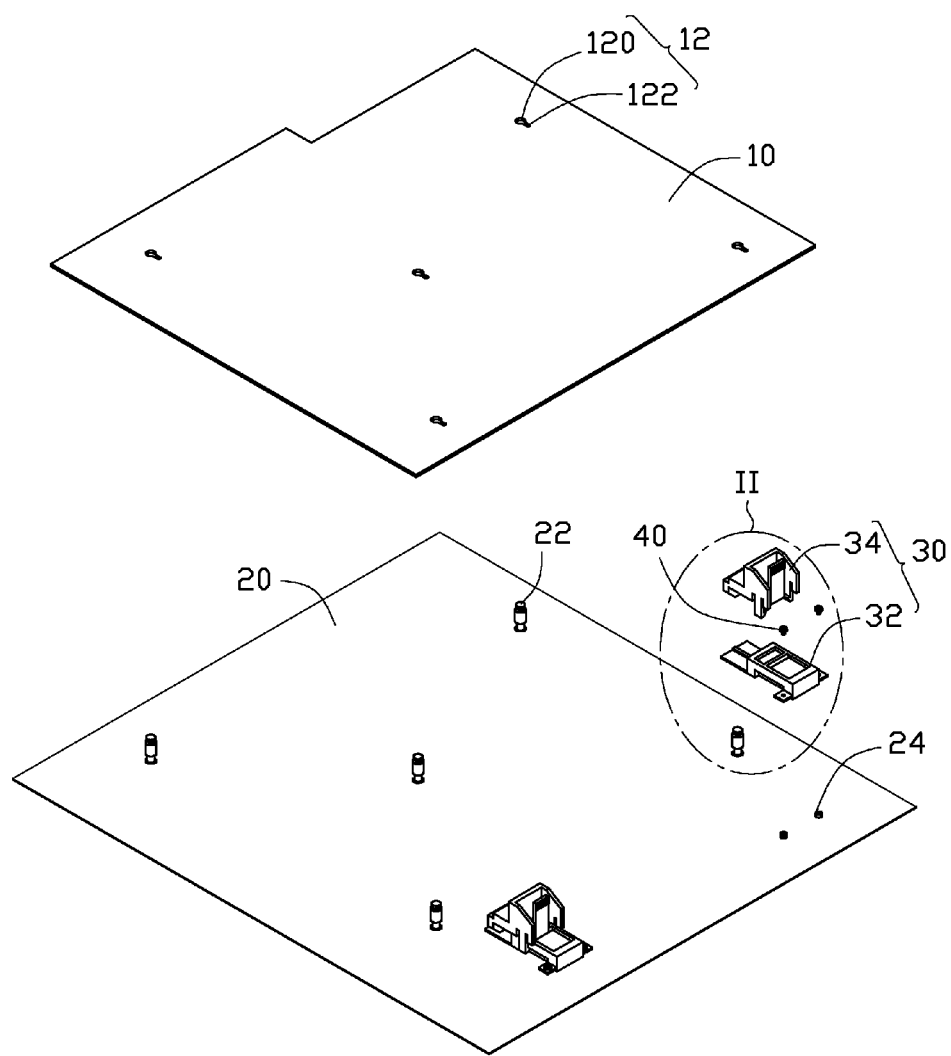
FIG. 1 is an exploded, isometric view of an exemplary embodiment of an electronic device, wherein the electronic device includes two fixing members, each fixing member including a movable body.
Figure 2:
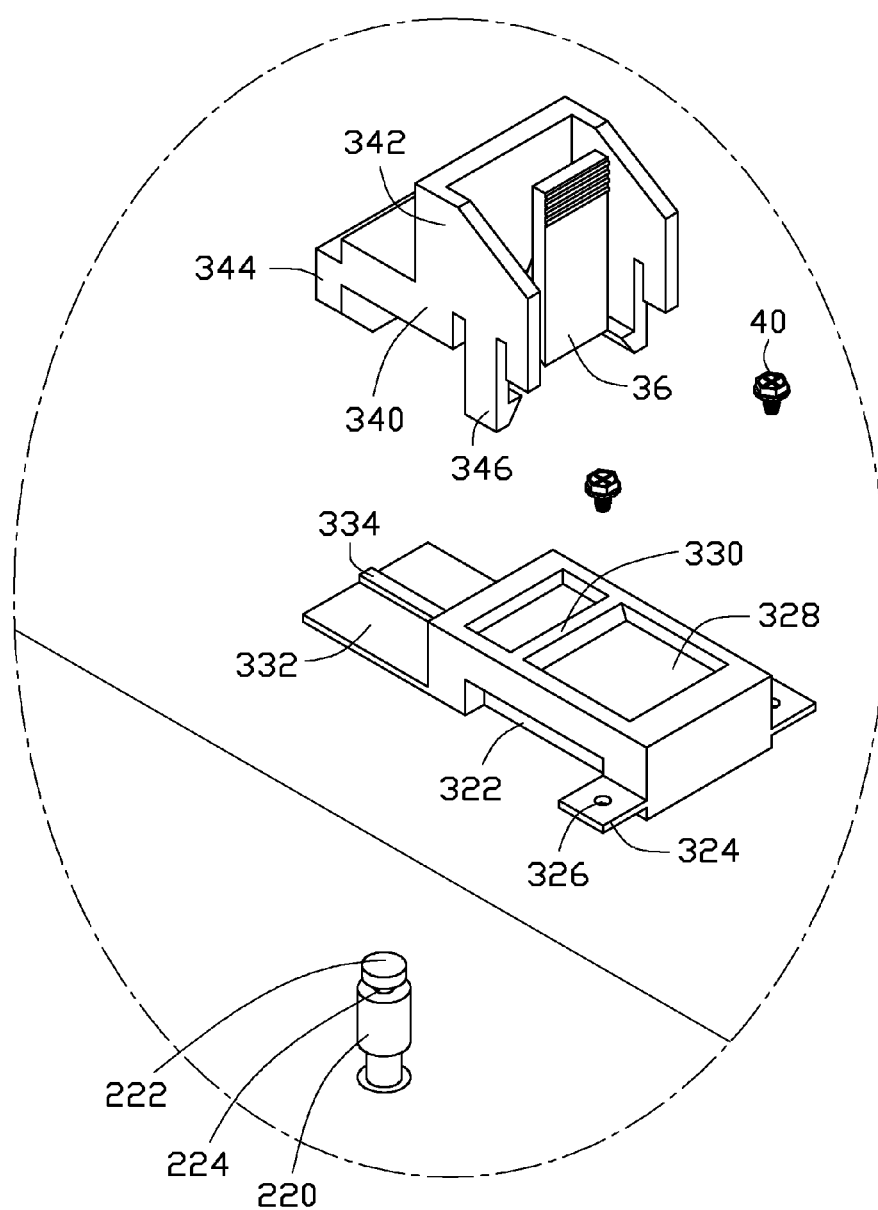
FIG. 2 is an enlarged view of the circled portion II of FIG. 1.
Figure 3:
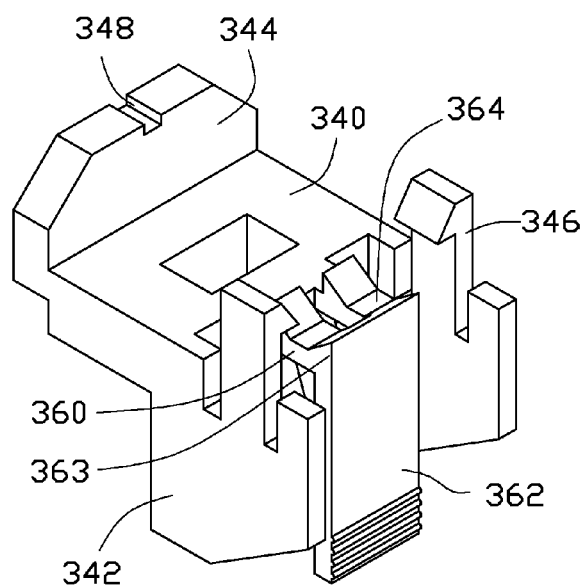
FIG. 3 is an inverted view of the movable body of FIG. 2.

FIGS. 1 to 3 show an exemplary embodiment of an electronic device. The electronic device includes a bottom wall 20, a motherboard 10, and two fixing members 30.

The motherboard 10 defines a plurality of through holes 12. Each through hole 12 includes a first hole 120 and a second hole 122 communicating with the first hole 120. The first hole 120 is greater than the second hole 122 in width.

A plurality of posts 22 extend from the bottom wall 20, corresponding to the through holes 12. Two standoffs 24 protrude from the bottom wall 20, adjacent to the posts 22. Each post 22 includes a supporting portion 220 connected to the bottom wall 20, a head 222, and a neck 224 connected between the supporting portion 220 and the head 222. A diameter of the head 222 is greater than a diameter of the neck 224 and a diameter of the second holes 122, but less than a diameter of the supporting portion 220 and a diameter of the first holes 120.

Each fixing member 30 includes a fixing body 32 and a movable body 34.

The fixing body 32 defines two slots 322 in lower portions of opposite sides, the slots 322 extending along the length of the fixing body 32. Two tabs 324 perpendicularly extend out from first ends of the opposite sides of the fixing body 32, each tab 324 defining a vertical fixing hole 326. A recess 328 is defined in a top surface of the fixing body 32. A block 330 protrudes from a bottom surface of the recess 328 and is perpendicular to the lengthwise direction of the fixing body 32. Opposite sides of the block 330 facing opposite ends of the fixing body 32 are slanted surfaces. An extension plate 332 extends from a lower portion of a second end of the fixing body 32 opposite to the first end. A bar 334 protrudes from a top surface of the extension plate 332 and extends along the lengthwise direction of the fixing body 32.

The movable body 34 includes a main portion 340, two extension pieces 342 perpendicularly extending up from first ends of opposite sides of the main portion 340, a supporting plate 344 connected to a lower portion of a second end of the main portion 340 opposite to the first end, and a latching portion 36 connected to a center of the first end of the main portion 340. A hook 346 extends down from an end of each extension piece 342 away from the supporting plate 344. A slide slot 348 is defined in a bottom surface of the supporting plate 344, parallel to the extension pieces 342. The latching portion 36 includes a connecting piece 360 connected to the first end of the main portion 340, an operation piece 362 perpendicularly extends up from a distal end of the connecting piece 360 away from the main portion 340, and a wedge-shaped protrusion 363 protrudes from a bottom surface of the connecting piece 360. An antiskid portion is formed on an outer surface of the operation piece 362. A trapezoid-shaped limiting slot 364 is defined in a bottom surface of the protrusion 363 and extends through opposite sides of the protrusion 363 in a direction perpendicular to the slide slot 348. Opposite sidewalls bounding the limiting slot 364 are a slanted surface.

Figure 4:
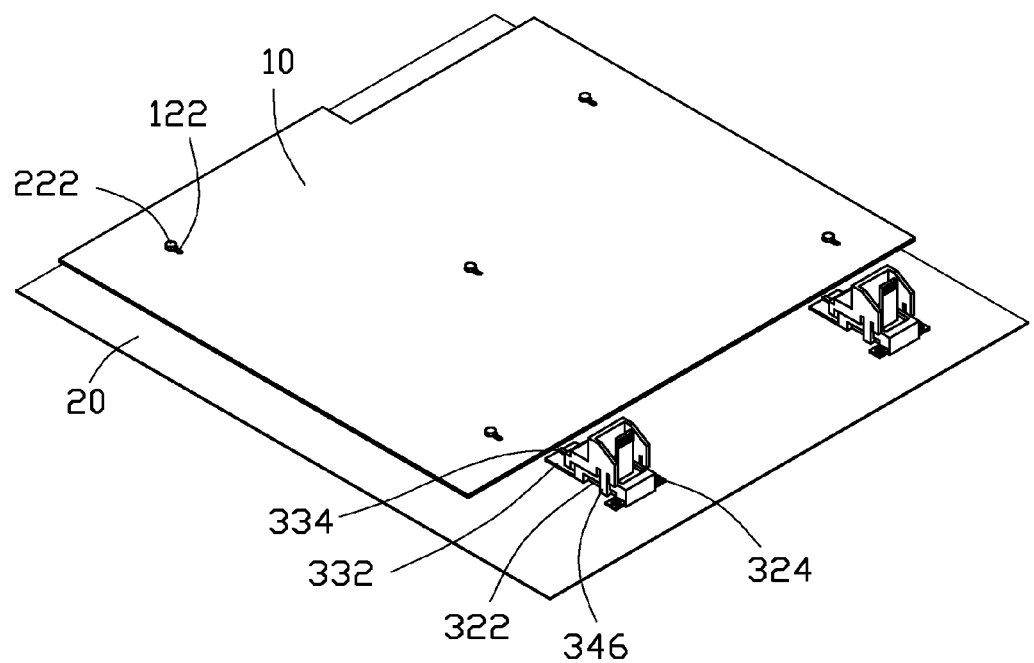
FIG. 4 is an assembled, isometric view of FIG. 1.
Figure 5:
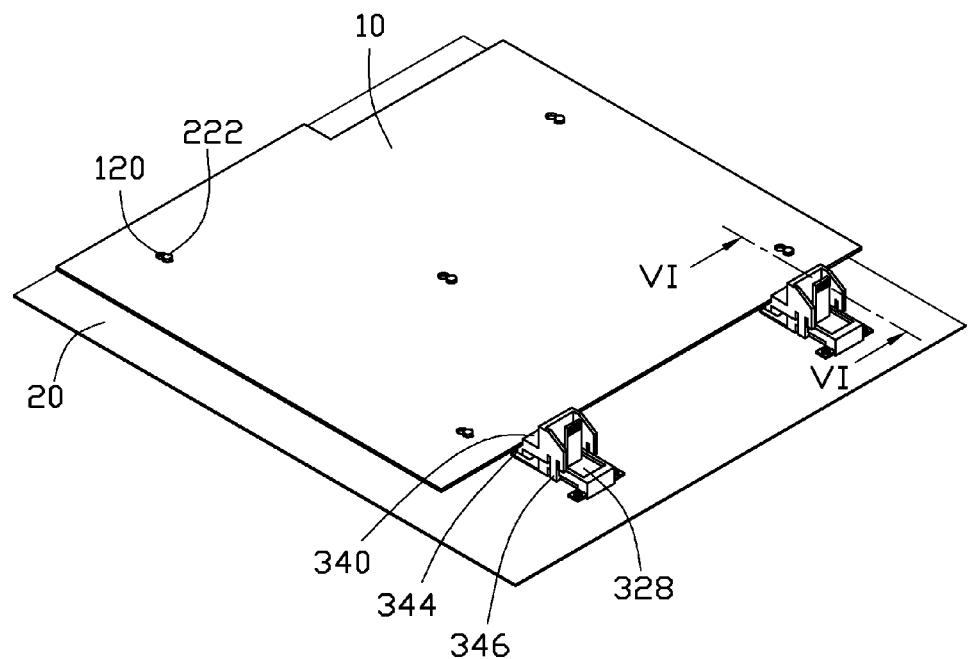
FIG. 5 is similar to FIG. 4, but showing a state of use.
Figure 6:
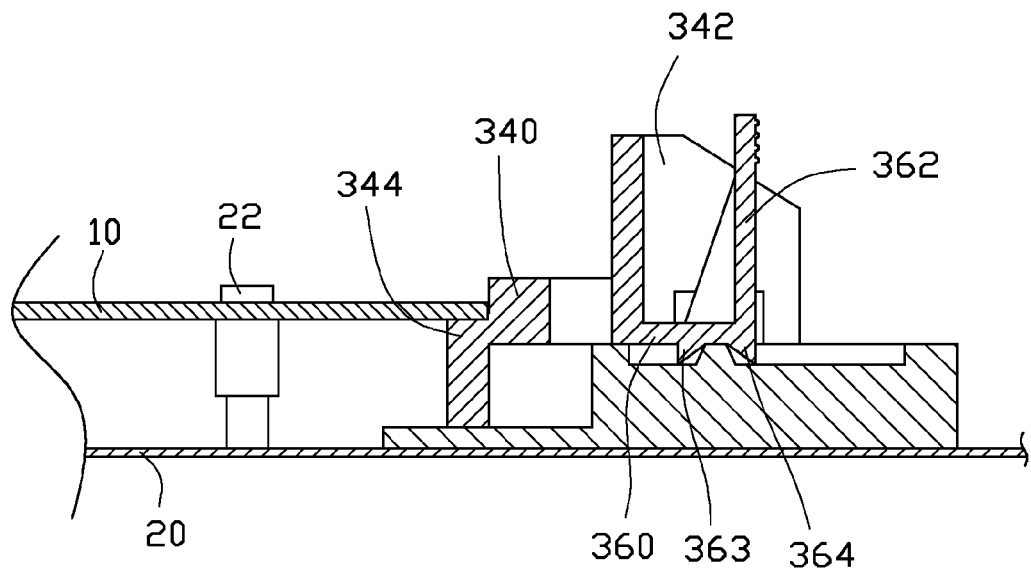
FIG. 6 is a cross-section view of FIG. 5, taken along the line of VI-VI.

FIGS. 4 to 6 show that in assembly, two fasteners 40, such as screws, extend through the fixing holes 326 of each fixing body 32 and then are engaged in the standoffs 24, thereby fixing the fixing body 32 to the bottom wall 20. The second end of the fixing body 32 opposite to the fixing holes 326 face toward the posts 22. The hooks 346 are deformed to slidably engage in the slots 322, thereby slidably mounting the movable body 34 to the fixing body 32. The slide slot 348 is slidably mated with the bar 334. The protrusion 363 is received in the recess 328.

The motherboard 10 is attached to the bottom wall 20, with the second holes 122 facing the fixing members 30. The heads 222 extend through the first holes 120, to allow the motherboard 10 to be supported on tops of the supporting portions 220. The motherboard 10 is then slid away from the fixing member 30s, until the necks 224 are abutted against end walls bounding the corresponding second holes 122 and away from the corresponding first holes 120. The motherboard 10 is sandwiched between the supporting portions 220 and the heads 222.

The movable bodies 34 are then slide toward the motherboard 10, the hooks 346 are slid along the corresponding slots 322, and the supporting plate 344 slides along the bar 334, until the block 330 is engaged in the limiting slot 364. The second ends of the movable body 34 abut against an end of the motherboard 10 adjacent to the fixing members 30, and the supporting plates 344 are inserted into a space between the bottom wall 20 and the motherboard 10, to support the motherboard 10, thereby fixing the motherboard 10 to the bottom wall 20.

In another embodiment, the supporting plate 344 and the extension plate 332 can be omitted.

In uninstalling the motherboard 10, the operation pieces 362 are deformed toward the motherboard 10 to facilitate the movably body 34 to disengage from the block 330 under moving the movable body 34 away from the motherboard 10. Therefore, the motherboard 10 then can be easily disengaged from the bottom wall 20.

It is believed that the present embodiments and their advantages will be understood from the foregoing description, and various changes may be made thereto without departing from the spirit and scope of the description or sacrificing all of their material advantages, the examples hereinbefore described merely being exemplary embodiments.

What is claimed is:

1. An electronic device, comprising:
   a bottom wall forming a plurality of posts; each post comprising a supporting portion connected to the bottom wall, a head, and a neck connected between the supporting portion and the head, wherein a diameter of the neck is less than diameters of the head and the supporting portion;
   a motherboard defining a plurality of through holes; each through hole comprising a first hole and a second hole communicated with the first hole, wherein the first hole is greater than the second hole in width, the diameter of the neck is less than the width of the second hole, the diameter of the head is less than the width of the first hole and greater than the width of the second hole;
   a fixing member comprising a fixing body mounted to the bottom wall and a movable body, a block protruding from a top of the fixing body, the movable body comprising a main portion slidably mounted to the fixing body and a latching member, the latching member comprising a connecting piece connected to the main portion, the connecting piece defining a limiting slot in a bottom;
   wherein the heads extend through the first holes, the necks abut against end walls bounding the corresponding second holes and away from the corresponding first holes, the motherboard is sandwiched between the heads and the supporting portions, the block is detachably engaged in the limiting slot, the main portion abuts against an end of the motherboard adjacent to the fixing member.

2. The electronic device of claim 1, wherein the fixing body defines two slots in opposite sides of the fixing member, two hooks extend from opposite sides of the main portion of the movable body and are sildably engaged the slots.

3. The electronic device of claim 1, wherein an operation piece extends up from the connecting piece.

4. The electronic device of claim 1, wherein the movable body further comprises a supporting plate extending from a lower portion of the end of the main portion abutting against the motherboard to be inserted between the bottom wall and the motherboard.

5. The electronic device of claim 4, wherein a slide slot is defined in a bottom surface of the supporting plate along a slide direction of the movable body, an extension plate extending from an end of the fixing member adjacent to the motherboard, a bar protrudes from the extension plate and slidably engages in the slide slot.

6. The electronic device of claim 1, wherein two standoffs protrude from the bottom wall, two tabs extend from opposite sides of the fixing body, two screws extend through the tabs and are engaged in the standoffs.

7. The electronic device of claim 1, wherein a protrusion protrudes from a bottom of the connecting piece, the limiting slot is defined in a bottom of the protrusion, the fixing member defines a recess in a top surface and slidably receiving the protrusion, the block protrudes from a bottom surface of the recess.

8. The electronic device of claim 7, wherein opposite sides of each of the block and the protrusion are slanted surfaces.

* * * * *